(12) United States Patent
Hayashi et al.

(10) Patent No.: US 7,839,640 B2
(45) Date of Patent: Nov. 23, 2010

(54) ELECTRONIC DEVICE AND A THERMAL CONNECTOR USED THEREIN

(75) Inventors: Tomoo Hayashi, Hitachinaka (JP); Tadakatsu Nakajima, Kasumigaura (JP); Yoshihiro Kondo, Tsuchiura (JP); Hiroyuki Toyoda, Hitachinaka (JP); Akio Idei, Hadano (JP); Shigeyasu Tsubaki, Odawara (JP)

(73) Assignee: Hitachi, Ltd, Tokyo (JP)

( * ) Notice: Subject to any disclaimer, the term of this patent is extended or adjusted under 35 U.S.C. 154(b) by 0 days.

(21) Appl. No.: 12/544,137

(22) Filed: Aug. 19, 2009

(65) Prior Publication Data
US 2010/0073865 A1    Mar. 25, 2010

(30) Foreign Application Priority Data
Sep. 24, 2008    (JP) .............................. 2008-244238

(51) Int. Cl.
*H05K 7/20* (2006.01)
(52) U.S. Cl. ....................... 361/699; 361/719; 361/721; 165/80.4; 165/104.33
(58) Field of Classification Search ........................ None
See application file for complete search history.

(56) References Cited

U.S. PATENT DOCUMENTS 6,807,056 B2 * 10/2004 Kondo et al. ................. 361/689
7,244,889 B2 * 7/2007 Fanuef et al. ............. 174/17 VA
7,380,409 B2 * 6/2008 Campbell et al. .......... 62/259.2
7,539,020 B2 * 5/2009 Chow et al. .................. 361/726
7,551,438 B2 * 6/2009 Seki ........................... 361/699
7,719,837 B2 * 5/2010 Wu et al. ..................... 361/699
2006/0256526 A1 * 11/2006 Hamman ..................... 361/699
2010/0103618 A1 * 4/2010 Campbell et al. ........... 361/699

FOREIGN PATENT DOCUMENTS

| JP | 8-116005 A | 5/1996 |
| JP | 2000-013064 A | 1/2000 |
| JP | 2000-356484 A | 12/2000 |
| JP | 2001-091174 A | 4/2001 |

* cited by examiner

*Primary Examiner*—Boris L Chervinsky
(74) *Attorney, Agent, or Firm*—Foley & Lardner, LLP (57) ABSTRACT

An electronic device comprises: a housing; blades each of which is detachable from the housing and on each of which at least CPU and a memory are mounted; first cooling devices each of that takes out heat generated in the blade outside the blade, each of said first cooling device having a heat release part in the form of an elongate column to be fixed to the blade; second cooling devices fixed to the housing to discharge heat transported from the first cooling devices outside the housing, each of said second cooling devices having a heat absorbing part, which is capable of containing the heat release part of the first cooling device; medium reservoirs each of which is put in fluid communication with a clearance, which is formed between the heat release part and the heat absorbing part when the heat release part is inserted into the heat absorbing part; a heat conducting medium stored in each of the medium reservoirs; pressurizing devices for pressurizing the heat conducting medium to supply the heat conducting medium to the clearance, and a detachable connecting part formed between the heat release part and the heat absorbing part.

6 Claims, 8 Drawing Sheets

ELECTRONIC DEVICE AND A THERMAL CONNECTOR USED THEREIN

BACKGROUND OF THE INVENTION

The present invention relates to an electronic device typified by blade servers which have been going to prevail rapidly in recent years, and more particular, to a thermal connector suited to be used in such electronic device, and an electronic device using the same.

Blade servers are offered in a state, in which blades having devices such as CPU (Central Processing Unit), a memory, a hard disk, etc. are loaded into a rack on which a power unit, a fan unit, a management module, etc. are mounted. In particular, the invention relates to a thermal connector between a heat pipe, through which heat of CPU is taken out from a blade, and a heat release device, from which heat taken out through the heat pipe is further discharged outside a rack.

In blade servers which have been rapidly increased in demand in recent years, further improvements in information processing capability and space-saving have been demanded. The information processing capability, however, has been spectacularly improved year by year accompanying with increase in performance of CPUs themselves. Further, an improvement in information processing capability per blade is achieved by increasing the number of CPUs mounted on a single blade. In addition, the number of blades which are mountable on a single rack is increased by thinning the blades. Due to an increase in amount of heat generation accompanied with improvements in performance of CPUs and thinning of blades, power density (heat generation density) of blade servers are spectacularly increased. Therefore, an improvement in cooling efficiency of servers is intensely desired.

Also, "redundancy design" and "maintenance during operation" realize high reliability of blade servers. In "the redundancy design", the structure of a blade server is designed such that devices, which fulfill the same function, are mounted in larger number than that essentially needed and a device having gone wrong can be covered by another device, which fulfills the same function. Also, in "the maintenance during operation", a maintenance work in the case where a device in a blade server goes wrong is performed without cutting off a power source of the blade server, whereby the server is prevented from being decreased in operating efficiency. In order to realize the maintenance during operation, it is required that respective units such as blades, or a power source unit, a fan unit, etc. can be mounted to and dismounted from a rack while a blade server operates. This is called hot-swap and characteristic of a blade server. Therefore, it is also required that a cooling device mounted on a blade be detachable.

Hereupon, a typical structure of a blade server will be described. A blade server includes several chassis mounted in a rack. Blades, power source units, fan units, management modules and communication modules are mounted in a chassis. Blades, fan units, and communication modules, respectively, are connected to management modules through a backplane. Electronic parts such as CPU, a memory, a chip set, a hard disk, etc. are mounted on a blade.

Presently, a mainstream cooling method comprises using a fan unit mounted on a chassis to flow air in a blade to cool respective electronic parts. A heat sink formed from a material, such as copper, aluminum, etc., having a high, thermal conductivity is mounted to a CPU, which is larger in heat generation amount among electronic parts. A heat sink mounted to a CPU has been larger in size year by year accompanying with increase of the heat generation amount of CPUs, and has been made high in performance by employing a heat pipe, for example.

However, by virtue of CPUs being spectacularly increased in heat generation amount and blades being thinned, measures of mounting a heat sink to a CPU to perform air-cooling in a blade approaches a limit.

Hereupon, a cooling system is conceivable, in which a heat transport device using a liquid loop and a heat transport device using evaporation are used to transport heat generated from a CPU outside a blade to dissipate heat. With this cooling system, a large-sized radiator or chiller is applicable as heat dissipate means outside a blade, so that it is possible to accommodate for a high heat generation amount of a CPU. On the other hand, the cooling system involves a problem of realizing hot-swap. As means for solving this problem, there is a method of using a coupler to connect between a heat transport device in a blade and a heat transport device outside a blade. However, this method involves a danger of liquid leakage since refrigerant liquid circulates through the coupler between the heat transport device in a blade and the heat transport device outside a blade.

In order to prevent the liquid leakage, it is desirable that the heat transport devices in a blade and outside a blade be completely closed. In this case, there is a need for a thermal connector for connection between the heat transport device in a blade and the heat transport device outside a blade with a small heat resistance.

Subsequently, there is cited a well-known technology with respect to a thermal connector. That is, JP-A-2000-13064 discloses an accessory and an electronic device using a thermal connector for cooling. Also, JP-A-2001-91174 discloses a connector used in electronic devices, industrial machinery, etc. to be detachable and to transport heat. Further, JP-A-2000-356484 discloses a heat-pipe thermal connector capable of detachably connecting between a heat pipe and a cooled member without an increase in heat resistance. JP-A-8-116005 (Japanese Patent No. 3395409) discloses a structure, in which fins for cooling a heat generating element and fins fixed to means for heat release to an outside are brought into contact with each other and a heat conducting medium is made present on contact surfaces.

A method for cooling the accessory described in JP-A-2000-13064 is one, in which heat generated in the accessory is transported to the electronic device through the thermal connector to be dissipated. However, a specific structure of the thermal connector is not disclosed.

The heat transfer connector described in JP-A-2001-91174 comprises a first connector member having a reception part, which is concave-shaped in section, a second connector member having an insertion part, which is convex-shaped in section, and a comb-shaped contact interposed between the first connector member and the second connector member to transfer heat. Both the connector members and the comb-shaped contact, respectively, are formed from a metallic material of favorable thermal conductivity. When both the connector members are connected to each other, the comb-shaped contact is elastically deformed following the reception part of the first connector member and so the solid bodies come into contact with each other to transfer heat therebetween.

Because of a system, in which the solid surfaces come into contact with each other to transfer heat therebetween, however, it is difficult in some cases to achieve a decrease in heat resistance due to influences of machining accuracy (surface roughness, waviness, etc. of tapered surfaces) of surfaces in contact with each other.

With the heat-pipe thermal connector described in JP-A-2000-356484, a heat pipe is inserted into a semi-cylindrical receiving portion to be pressed down whereby the heat pipe and the receiving portion are brought into contact with each other to transfer heat therebetween.

Because of a system, in which the heat pipe is inserted axially into the receiving portion, however, it is difficult to form a structure, in which the heat pipe and the receiving portion are brought into close contact with each other, so that a contact area being effective for heat transfer becomes small to make it difficult to achieve a decrease in heat resistance.

Also, as measures of improving a thermal connector, in which solid surfaces come into contact with each other to transfer heat, in heat transference, a heat conducting medium such as grease, oil, or the like is interposed between the solid surfaces in some cases. When a heat conducting medium such as grease, oil, or the like is used in an opened space over a long term, there is caused a problem that volatile components contained in the heat conducting medium diffuse in an outside air to lead to deterioration.

JP-A-8-116005 discloses a structure, in which oil is filled to improve the heat transference between comb-shaped contact heat transfer members and an oil filled space is closed to prevent oil deterioration. With the conventional technology disclosed in JP-A-8-116005, however, a semiconductor module cannot be exchanged unless a closed device is disassembled after the device is stopped and oil is removed, so that only a part of blades cannot be pulled out or inserted to be exchanged while the whole server remains in operation. That is, hot-swap, which characteristic of a blade server, becomes difficult.

In summary, in an electronic device, such as a blade server, in need of hot-swap, it is problematic to make measures against deterioration of grease and hot-swap compatible with each other in case of using a thermal connector, in which a heat conducting medium such as grease is present.

SUMMARY OF THE INVENTION

The invention has been thought of in view of the problems in the related art and has its object to provide a thermal connector, by which a heat release part and a heat absorbing part are made detachable and which connects between the heat release part and the heat absorbing part with a smaller heat resistance than a predetermined heat resistance, which complies with design specifications, and an electronic device, in which a cooling device using the thermal connector is not deteriorated in performance even when a CPU blade is repeatedly mounted to and dismounted from a server frame.

In order to attain the object, the invention provides an electronic device comprising: a housing; a plurality of blades, each of the blades being detachable from at least one of sides of the housing and including at least an electronic part such as a CPU, a memory, a chip set, and the like; first cooling means that takes out heat generated in the blade; second cooling means fixed to the housing to discharge heat transported from the first cooling means outside the housing, wherein the first cooling means comprises a heat release part in the form of an elongate column to be fixed to the blade so that a length direction of the column is made substantially in parallel to a direction, in which the blade is mounted and dismounted, and wherein the second cooling means comprises: a heat absorbing part provided with an elongate, cylindrical-shaped hole, which is capable of containing the heat release part of the first cooling means; a medium reservoir put in communication with an elongate, pipe-shaped clearance, which is formed between the heat release part of the first cooling means and the heat absorbing part of the second cooling means when the heat release part of the first cooling means is inserted into the heat absorbing part of the second cooling means; a heat conducting medium stored in the medium reservoir; and pressurizing means for pressurizing the heat conducting medium stored in the medium reservoir to supply the heat conducting medium to the clearance, and wherein a detachable connecting part (thermal connector) is used between the heat release part of the first cooling means and the heat absorbing part of the second cooling means.

Also, the thermal connector of the invention comprises: a sealing member for a closed structure that prevents the heat conducting medium from coming into contact with an outside air; and a cap for returning the heat conducting medium to the medium reservoir when the heat release part of the first cooling means is separated from the heat absorbing part of the second cooling means.

Therefore, a heat resistance between the heat release part of the first cooling means and the heat absorbing part of the second cooling means can be made smaller than a predetermined value, which complies with design specifications, volatile components contained in the heat conducting medium can be inhibited from diffusing into the atmosphere to be susceptible to deterioration, and mounting and dismounting between the heat release part of the first cooling means and the heat absorbing part of the second cooling means can be performed repeatedly.

According to the invention, there is provided pressurizing means for pressurizing the heat conducting medium to flow the same into a clearance between the heat release part of the first cooling means and the heat absorbing part of the second cooling means, so that a heat resistance between the heat release part of the first cooling means and the heat absorbing part of the second cooling means can be made smaller than a predetermined value, which complies with design specifications.

Also, a sealing member is provided to maintain in airtight the medium reservoir and the clearance whereby it is possible to suppress deterioration of the heat conducting medium.

Further, since there is provided a structure that scrapes off the heat conducting medium present in the clearance to return the same to the medium reservoir when the heat release part of the first cooling means is pulled out of the heat absorbing part of the second cooling means, it is possible to repeatedly insert the heat release part of the first cooling means into the heat absorbing part of the second cooling means to fill the heat conducting medium into the clearance.

Therefore, it is possible to provide a thermal connector, by which first cooling means mounted to CPU loaded on a blade of an electronic device, which is easily detachable from a housing like a blade server, is made detachable from second cooling means fixed to the housing and heat from CPU can be transported to the second cooling means from the first cooling means, and an electronic device, which is high in performance and in reliability and uses the thermal connector.

Other objects, features and advantages of the invention will become apparent from the following description of the embodiments of the invention taken in conjunction with the accompanying drawings.

DESCRIPTION OF THE PREFERRED EMBODIMENTS

Embodiments of the invention will be described hereinafter in detail with reference to the drawings.

Figure 1:
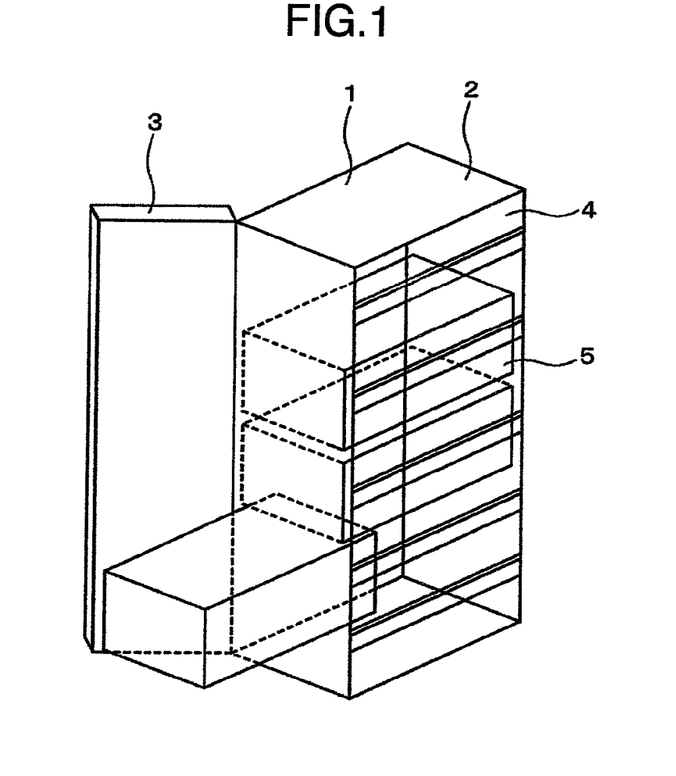
FIG. 1 is a conceptual, perspective view showing construction of an electronic device of rack mount system of the invention, in which a blade server etc. are mounted.

FIG. 1 is a conceptual, perspective view showing construction of an electronic device of rack mount system of a first embodiment of the invention, in which a blade servers etc. are mounted. FIG. 1 shows, in perspective, a part of the electronic device for the sake of understanding. In addition, as shown in FIG. 1, a rack mount cabinet 1 includes a housing 2, a lid 3, and a plurality of shelves 4 formed to assume a shape based on particular standards such as IEC (International Electrical Commission) standards/EIA (The Electrical Industries Association) standards, or the like. Blade servers 5 having individual functions can be selectively mounted in a free arrangement on the plurality of shelves 4 whereby the system structure can have both flexibility and scalability.

Figure 2:
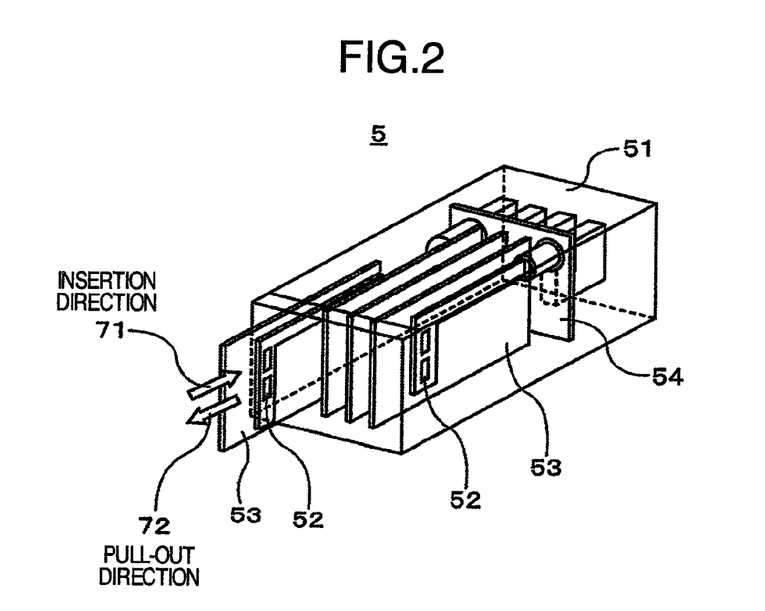
FIG. 2 is a perspective view showing an outline of structure of a blade server according to the invention.

FIG. 2 is a perspective view showing an outline of structure of the blade server 5 in the invention. The blade server 5 includes, in a server frame 51, a plurality of CPU blades 53 on each of which a CPU 52 is mounted, a backplane 54 for connecting the plurality of CPU blades 53, a power source module, a switch module, a management module, etc., each of which is not shown in FIG. 2.

In some cases, the CPU blade 53 is inserted into and pulled out from the server frame 51 in directions indicated by arrows 71, 72 in the drawing for the sake of maintenance or the like while the blade server 5 is operated. Note that the blade server 5 has an important feature in that even when the blade server 5 is operated, any one or ones of the CPU blades 53 mounted on the blade server 5 are detachable (hot-swap).

As electronic devices are heightened in performance and in function, it is intensely desired that in order to increase the shelves 4 on the rack mount cabinet 1, on which the blade servers 5 are mounted, in number in conformity with that situation, in which individual blade servers 5 mounted on the rack mount cabinet 1 shown in FIG. 1 become many in number, individual blade servers 5 mounted on the rack mount cabinet 1 be made small in size and space-saving of a cooling device be made. On the other hand, semiconductor devices, such as the CPU 52, etc., mounted on an electronic device are increased in heat generation amount as they are heightened in performance. Further, it is intensely demanded to realize a cooling method of good efficiency in that situation, in which wide fluctuations in heat generation amount are brought about depending upon a work content.

Referring to an outline drawing of FIG. 3 attached hereto, an explanation will be given hereinafter to a cooling device 6, according to the invention, which has the features described above, corresponds to the blade server 5, for which the various requirements described above are made, and satisfies such requirements.

As apparent from FIG. 3, the cooling device 6 comprises a first cooling device (referred below to as "means") 61, second cooling means 62, and a thermal connector 63.

Figure 3:
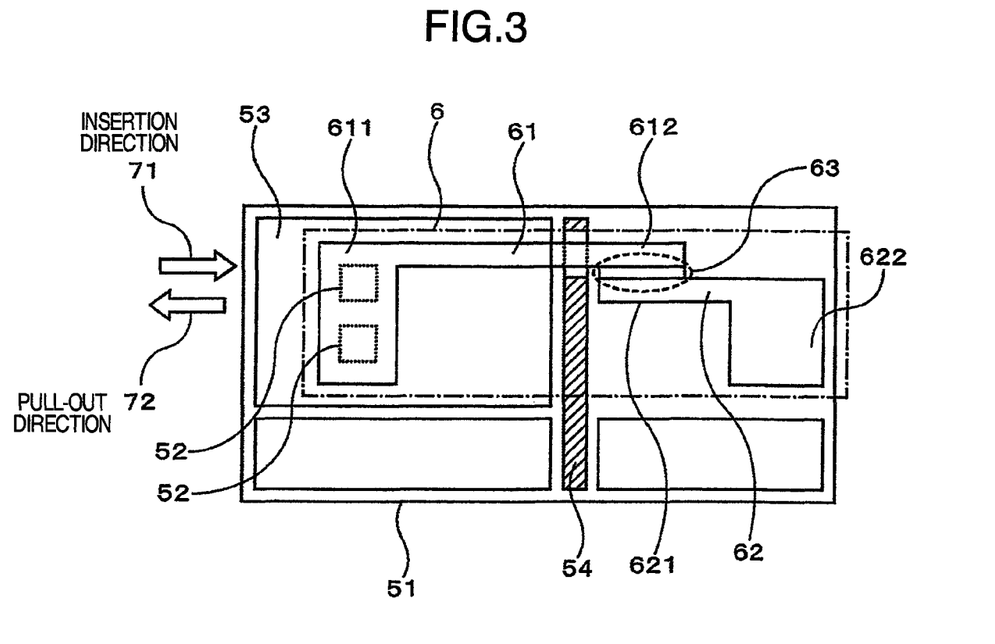
FIG. 3 is a conceptual, cross sectional view showing a transport route of heat generated from CPU, in the invention.

The first cooling means 61 has its heat absorbing part 611 connected to the CPU 52 with a smaller heat resistance than a predetermined heat resistance, which complies with design specifications, thus transporting heat generated from the CPU 52 rearwardly of the CPU blade 53, that is, in a right direction in FIG. 3. The first cooling means 61 is mounted in the CPU blade 53 to be mounted or dismounted together with the CPU blade 53. In a state, in which the CPU blade 53 is mounted in the server frame 51, a heat release part 612 of the first cooling means 61 is arranged in a position, in which it extends through the backplane 54 from the CPU blade 53.

Refrigerant liquid is sealedly charged into the first cooling means 61 to efficiently transport heat making use of phase change. Alternatively, refrigerant liquid sealedly charged into the first cooling means 61 is circulated to efficiently transport heat.

The second cooling means 62 absorbs heat from the first cooling means 61 through the thermal connector 63 to finally release the heat outside the server frame 51. A heat absorbing part 621 of the second cooling means 62 is mounted in the server frame 51 and connected to the heat release part 612 of the first cooling means 61 through the thermal connector 63 with the thermal resistance being a smaller value than a predetermined value, which complies with design specifications.

Refrigerant liquid is sealedly charged into the second cooling means 62, and the refrigerant liquid is circulated to transport heat from the heat absorbing part 621 of the second cooling means 62 to a heat release part 622 of the second cooling means 62. Alternatively, the second cooling means 62 may transport heat making use of phase change of refrigerant liquid sealedly charged thereinto.

The heat release part 622 of the second cooling means 62 comprises a radiator for heat exchange with an air and is mounted in a rear portion of the server frame 51. Instead of this, while not shown, the heat release part 622 of the second cooling means 62 may release heat to a heat absorbing part of third cooling means, which releases heat outside the server frame 51. Also, while not shown likewise, the heat release part 622 of the second cooling means 62 may be mounted outside the server frame 51 to release heat with a radiator, a chiller unit, or the like.

Since the first cooling means 61 and the second cooling means 62, respectively, contain the refrigerant liquid but constitute a closed system, there is no danger of liquid leakage.

In the disclosure of the present application, the thermal connector 63 connects between the heat release part 612 of the first cooling means 61 and the heat absorbing part 621 of the second cooling means 62 with a smaller heat resistance than a predetermined value, which complies with design specifications, and is structured to make the heat release part 612 of the first cooling means 61 detachable from the heat absorbing part 621 of the second cooling means 62.

Subsequently, a detailed structure of the thermal connector 63 according to the embodiment will be described with reference to FIGS. 4 to 9.

Figure 4:
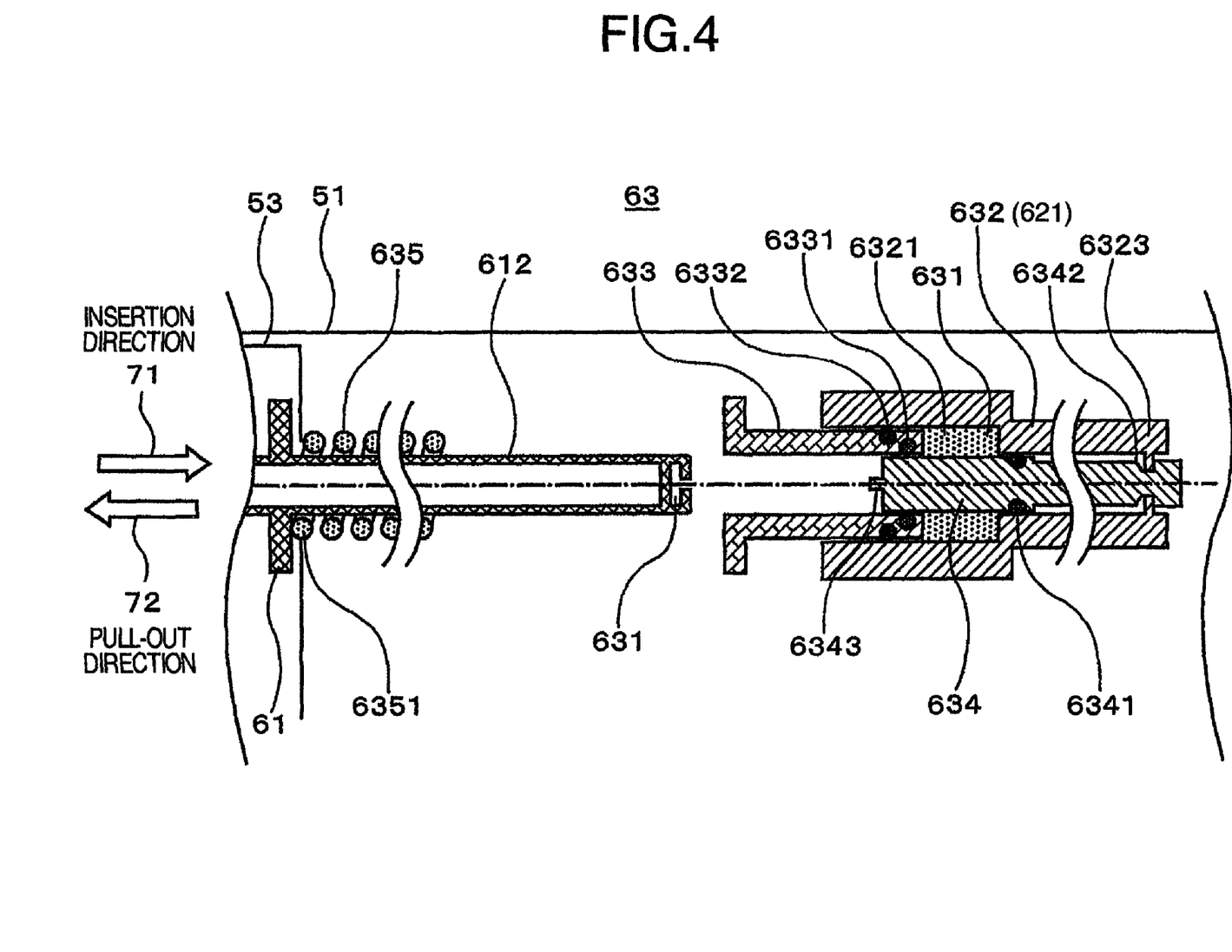
FIG. 4 is a cross sectional view showing the detail of a thermal connector in a state, in which a CPU blade is not inserted into a server frame, in the invention.

FIG. 4 is a cross sectional view showing the thermal connector 63 and the neighborhood thereof in a state, in which the CPU blade 53 is not inserted into the server frame 51.

The thermal connector 63 comprises heat conducting medium 631, a socket 632, a piston 633, and a cap 634. Also, a compression spring 635 is fixed to the first cooling means 61 mounted on a side of the CPU blade 53.

The heat conducting medium 631 is present between the heat release part 612 of the first cooling means 61 and the heat absorbing part 621 of the second cooling means 62 to provide a connection therebetween with a smaller heat resistance than a predetermined value, which complies with design specifications, when the CPU blade 53 is operated. The heat conducting medium 631 comprises, for example, heat conducting grease, heat conducting compound, oil, or the like. A part of the socket 632 constitutes the heat absorbing part 621 of the second cooling means 62 shown in FIG. 3.

As shown in FIG. 4, in the state, in which the CPU blade 53 is not inserted into the server frame 51, a major part of the heat conducting medium 631 is stored in a medium reservoir 6321. The medium reservoir 6321 is defined by the socket 632, the piston 633 and the cap 634.

An explanation will be given to sealing parts in three locations on the medium reservoir 6321. At least one sealing member 6341 (for example, an O-ring) is provided on the cap 634 in order to provide sealing between the socket 632 and the cap 634. Also, at least one sealing member 6331 (for example, an O-ring) is mounted on the piston 633 in order to provide sealing between the piston 633 and the cap 634. Further, at least one sealing member 6332 (for example, an O-ring) is mounted on the piston 633 in order to provide sealing between the socket 632 and the piston 633. Accordingly, the heat conducting medium 631 is airtightly sealed in the medium reservoir 6321 by the sealing members 6341, 6331, 6332.

When being left in contact with an outside air over a long term, volatile components contained in the heat conducting medium 631 diffuse into the atmosphere to cause a fear of a decrease in performance of heat conduction and deterioration such as sticking or the like. The structure of the thermal connector according to the invention has a feature in that the heat conducting medium 631 is hard to deteriorate since the heat conducting medium 631 is airtightly sealed.

Subsequently, an explanation will be given to an operation of the thermal connector 63 in a process, in which the CPU blade 53 is inserted into the server frame 51.

Figure 5:
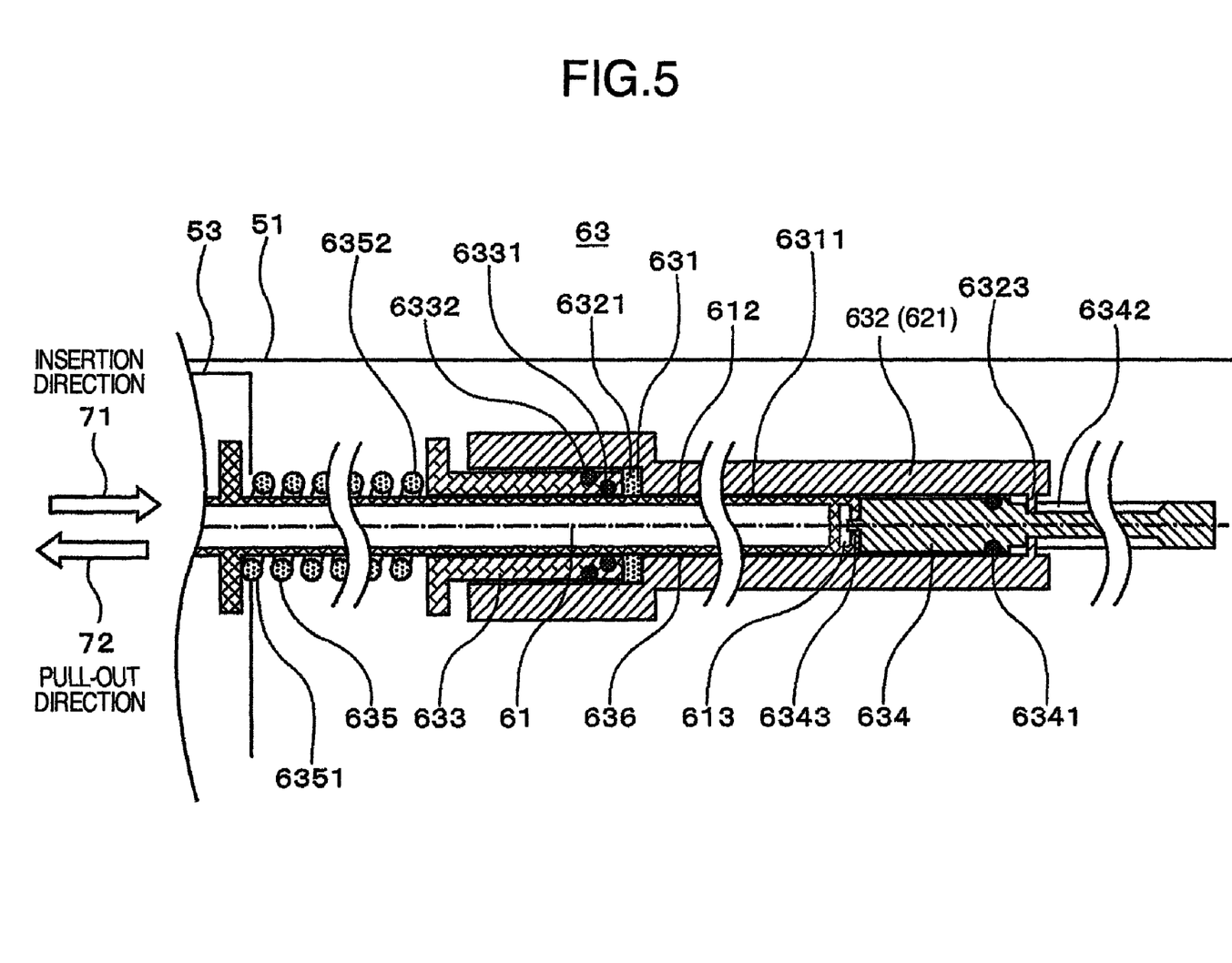
FIG. 5 is a cross sectional view showing the detail of the thermal connector in a state, in which the CPU blade is fully inserted into the server frame, in the invention.

FIG. 5 is a cross sectional view showing the thermal connector 63 and the neighborhood thereof in a state, in which the CPU blade 53 is fully inserted into the server frame 51.

That process, during which the CPU blade 53 is inserted into the server frame 51, is one, in which the state shown in FIG. 4 is changed to the state shown in FIG. 5.

An end 6351 of the compression spring 635 is in contact with the first cooling means 61 as shown in FIG. 4. Alternatively, while not shown, the end 6351 of the compression spring 635 may be in contact with the CPU blade 53. As the CPU blade 53 is inserted into the server frame 51, the end 6351 of the compression spring 635 moves in an insertion direction 71 in synchronous with insertion of the CPU blade 53. As the CPU blade 53 is inserted into the server frame 51, another end 6352 of the compression spring 635 comes into contact with the piston 633 to push the piston 633 in the insertion direction 71. Thereby, the piston 633 pressurizes the heat conducting medium 631 in the medium reservoir 6321.

Figure 6:
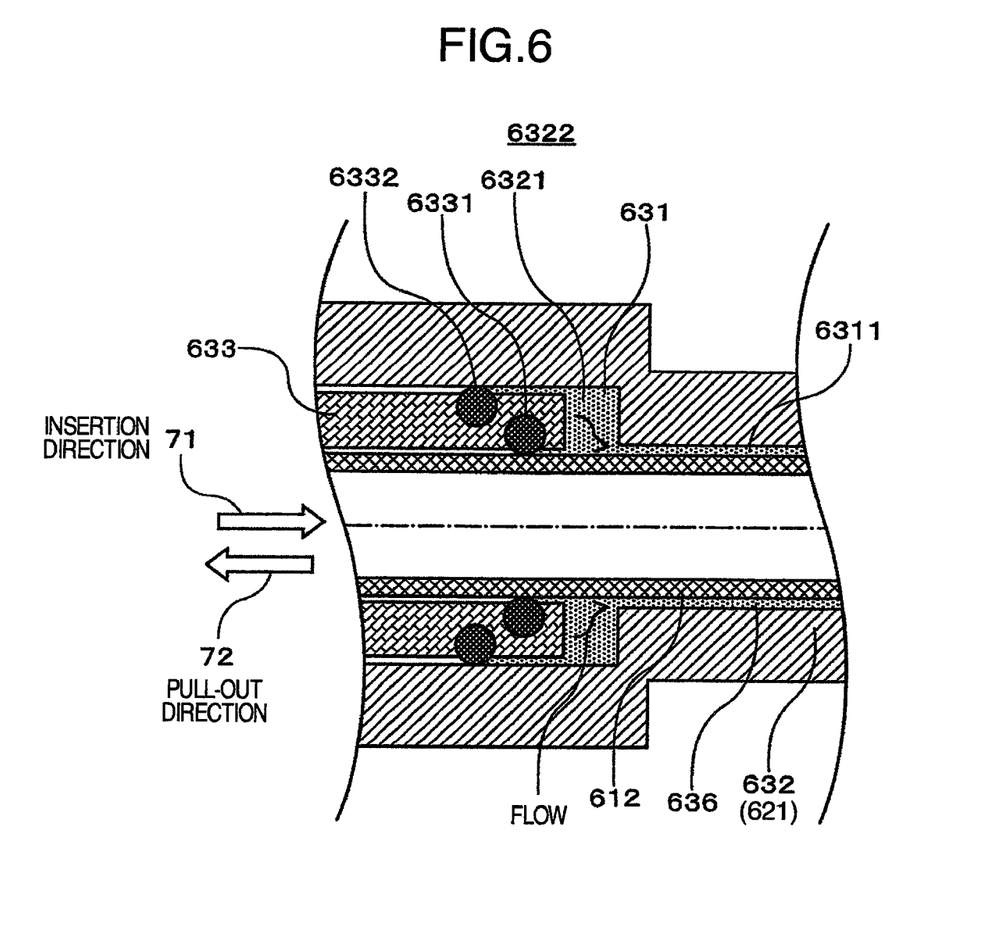
FIG. 6 is a cross sectional view showing movements of heat conducting medium in the thermal connector in the invention.

FIG. 6 shows, in enlarged scale, a neighborhood 6322 of the medium reservoir at this time. The heat conducting medium 631, in the medium reservoir 6321, pressurized by the piston 633 flows into a clearance 636 between the heat release part 612 of the first cooling means 61 and the socket 632. At this time, the sealing members 6331, 6332 provided on the piston 633 prevent the heat conducting medium 631 from coming off in a pulling-out direction 72. Also, the medium reservoir 6321 is decreased in volume in this process.

Subsequently, an explanation will be given to the state, in which the CPU blade 53 shown in FIG. 5 is fully inserted into the server frame 51.

At this time, a heat conducting medium 6311 having flowed into the clearance 636 thermally connects between the heat release part 612 of the first cooling means 61 and the heat absorbing part 621 of the second cooling means 62 with a smaller heat resistance than a predetermined value, which complies with design specifications. Also, the heat conducting medium 6311 having flowed into the clearance 636 is airtightly sealed by the sealing members 6341, 6331, 6332. Thereby, it is possible to suppress deterioration of the heat conducting medium 6311 also while the CPU blade 53 is operated.

On the other hand, it is conceivable that gas is entrained into the heat conducting medium 6311 for some reason. The gas thus entrained inhibits heat transfer between the heat release part 612 of the first cooling means 61 and the heat absorbing part 621 of the second cooling means 62. Hereupon, the heat conducting medium 6311 in the medium reservoir 6321 and the clearance 636 is pressurized by the compression spring 635. Thereby, the gas entrained into the heat conducting medium 6311 is compressed, so that the gas thus entrained is decreased in volume or in outer peripheral area not to adversely affect the heat transfer.

Succeedingly, an explanation will be given to a process, in which the CPU blade 53 is pulled out from the server frame 51, that is, an operation of the thermal connector 63 while the state shown in FIG. 5 is changed to the state shown in FIG. 4.

At this time, the heat release part 612 of the first cooling means 61 and the cap 634 are connected to each other by a connecting mechanism 64 described in detail with reference to FIGS. 7 to 9. Therefore, when the CPU blade 53 is pulled out from the server frame 51, the cap 634 goes together with the heat release part 612 of the first cooling means 61 to move in the pulling-out direction 72. During this process, the sealing member 6341 on the cap 634 shown in FIGS. 4 and 5 scrapes off a major part of the heat conducting medium 6311 present in the clearance 636 to return the same in the pulling-out direction 72. Thereby, while the medium reservoir 6321 is increased in volume, the heat release part 612 of the first cooling means 61 is pulled out.

When the cap 634 is moved to a position shown in FIG. 4, the connecting mechanism 64 separates the cap from the heat release part 612 of the first cooling means 61, so that the cap 634 stops in the position shown in FIG. 4. When the heat release part 612 of the first cooling means 61 is pulled out from the socket 632, the heat conducting medium 631 adhering on a surface of the heat release part 612 of the first cooling means 61 is wiped off by the sealing member 6331.

When the heat release part 612 of the first cooling means 61 is completely pulled out from the socket 632, the medium reservoir 6321 is airtightly sealed by the sealing members 6341, 6331, 6332. The thermal connector 63 is put in the state shown in FIG. 4. Thereby, the insertion process and the pulling-out process can be performed repeatedly.

Subsequently, the connecting mechanism 64 in the embodiment will be described with reference to FIGS. 7 to 9.

Figure 7:
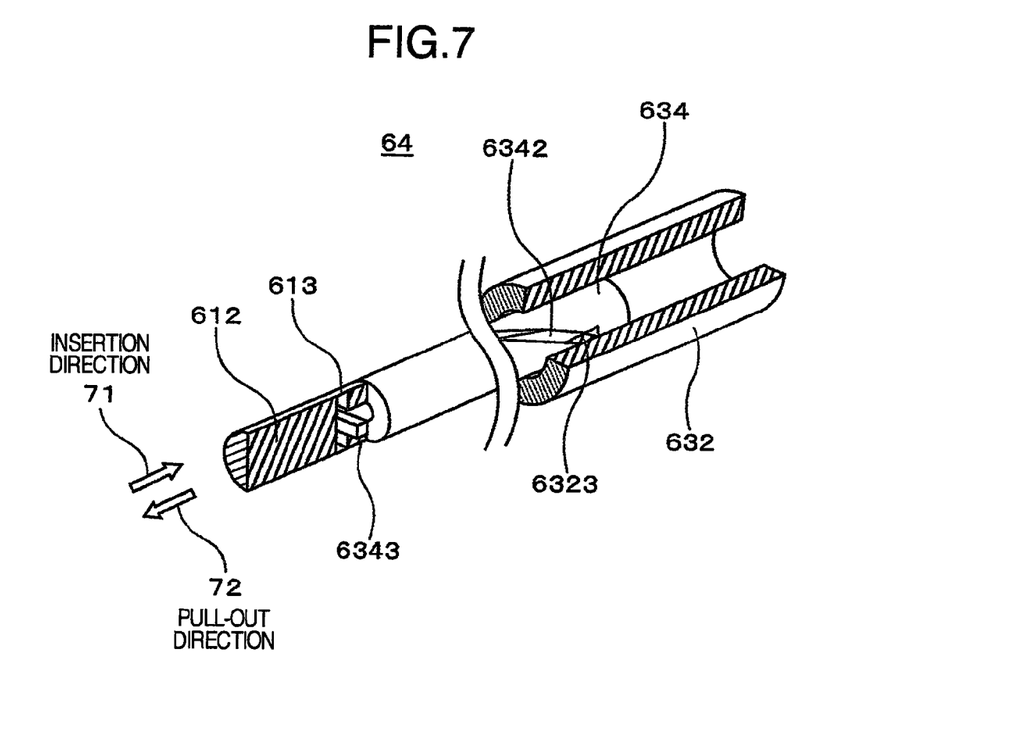
FIG. 7 is a view showing an embodiment of a connecting mechanism in the invention.

FIG. 7 is a cross sectional view showing a state just after the heat release part 612 of the first cooling means 61 comes into contact with a tip end of the cap 634 and the cap 634 is not yet moved from an initial position. FIG. 8 is a cross sectional view showing a state when the heat release part 612 of the first cooling means 61 is inserted a little from the state of FIG. 7 and the connecting mechanism 64 begins connection. FIG. 9 is a cross sectional view showing a state when the heat release part 612 of the first cooling means 61 is inserted further from the state of FIG. 8 and the connecting mechanism 64 accomplishes complete connection.

As shown in FIG. 7, in the state, in which the heat release part 612 is not inserted into the socket 632, the connecting mechanism 64 has not accomplished fitting and a connecting part of the cap 634 can be inserted into a connecting part 613 of the first cooling means 61.

Figure 8:
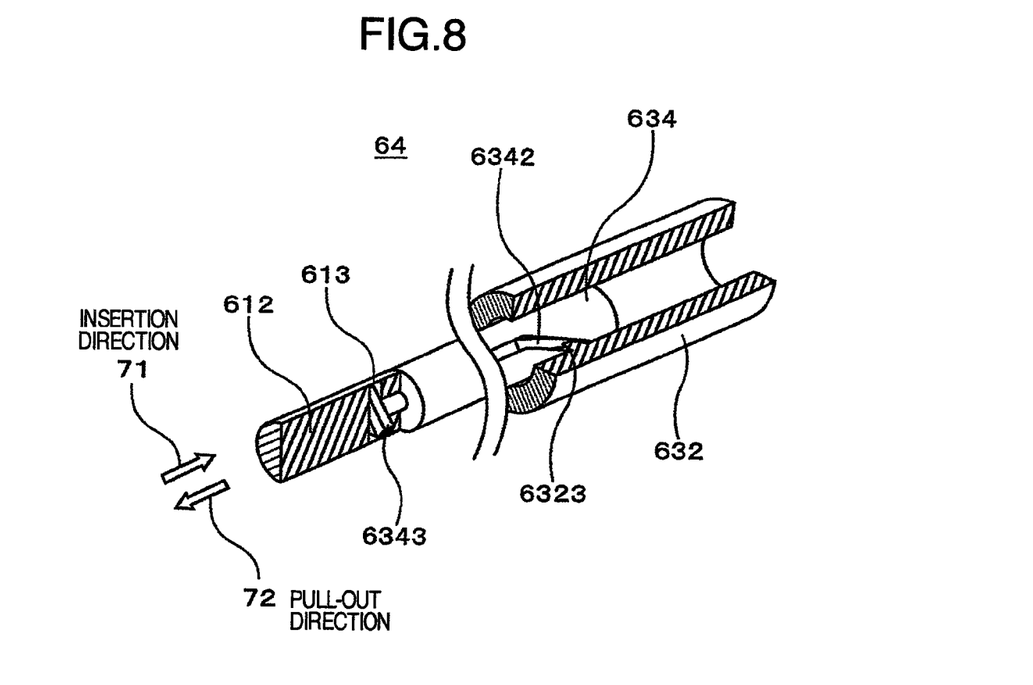
FIG. 8 is a view showing the embodiment of the connecting mechanism in the invention.
Figure 9:
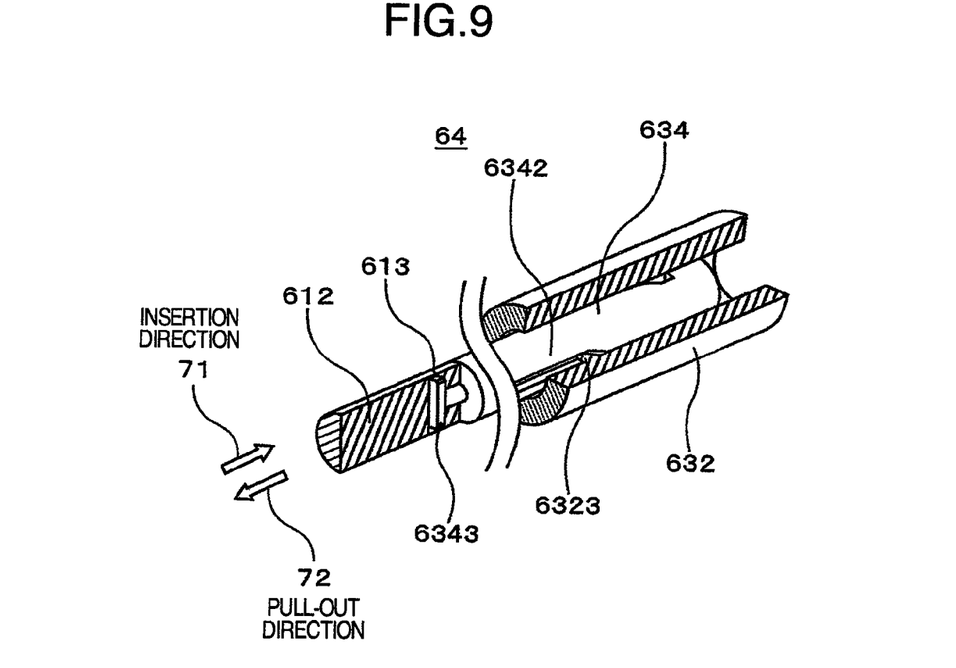
FIG. 9 is a view showing the embodiment of the connecting mechanism in the invention.

While the cap 634 moves in the insertion direction 71, a groove 6342 provided on the cap 634 to extend straight on the way and spirally therefrom moves along a pin 6323 provided on the socket 632 to thereby be rotated in a manner shown in FIG. 8. As shown in FIG. 9, when the cap 634 has been fully rotated, the connecting part 613 provided at a tip end of the heat release part 612 of the first cooling means 61 and a connecting part 6343 provided at a tip end of the cap 634 fit together. Thereby, the heat release part 612 of the first cooling means 61 and the cap 634 are coupled together.

On the other hand, while the cap 634 moves in the pulling-out direction 72, it is rotated in a reverse direction to that in a process of insertion owing to the same mechanism as that in the process of insertion whereby the heat release part 612 of the first cooling means 61 and the cap 634 separate from each other.

Since the embodiment provides a structure, in which the heat conducting medium 631 is caused to flow into the clearance 636 between the heat release part 612 of the first cooling means 61 and the socket 632, a heat resistance between the heat release part 612 of the first cooling means 61 and the heat absorbing part 621 of the second cooling means 62 can be made smaller than a predetermined value, which complies with design specifications. Also, according to the embodiment, the medium reservoir 6321 and the clearance 636 shown in FIG. 5 are airtightly structured by the sealing members 6331, 6332, 6341, so that it is possible to suppress deterioration of the heat conducting medium 631. Further, according to the embodiment, when the heat release part 612 of the first cooling means 61 shown in FIG. 5 is pulled out from the socket 632, the cap 634 scrapes off the heat conducting medium 6311 present in the clearance 636 to return the same into the medium reservoir 6321, so that it is possible to repeatedly insert the heat release part 612 of the first cooling means 61 into the socket 632 to fill the heat conducting medium 631 into the clearance 636 therebetween.

A connecting mechanism on the thermal connector in a second embodiment according to the invention will be described with reference to FIG. 10.

The second embodiment is the same as the first embodiment in the structures of first cooling means 61, second cooling means 62, and a thermal connector but different therefrom in the structure of a connecting mechanism, in which a bolt 6344 attached to a cap 634b is rotated by means of a tool from a back surface side of the server frame 51 shown in FIG. 2, that is, a right side in FIG. 2 whereby the cap 634b and a heat release part 612b of the first cooling means 61 are coupled together.

Figure 10:
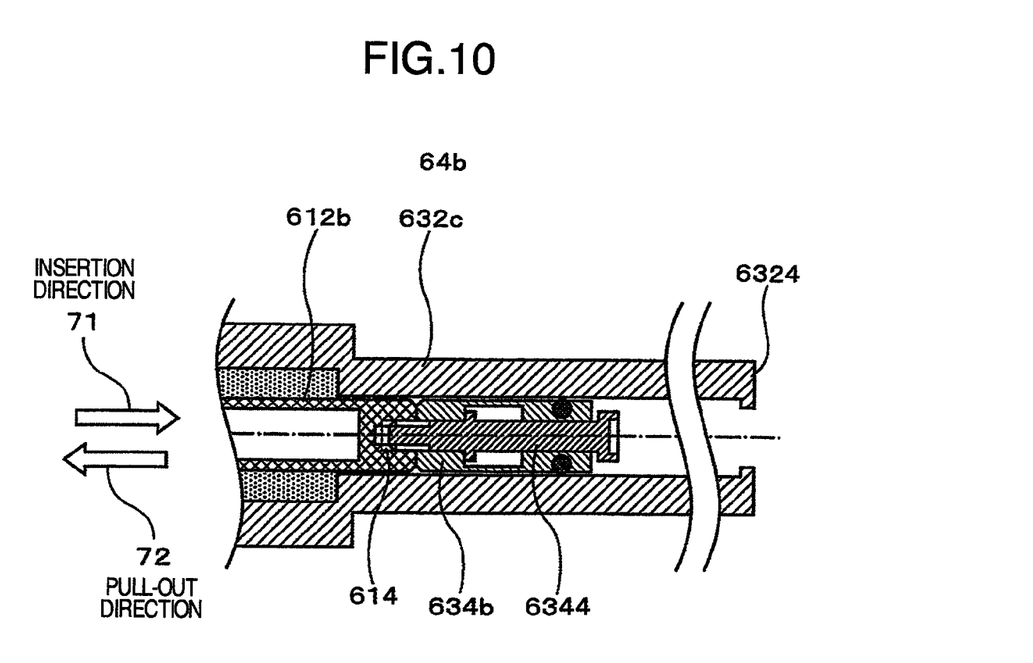
FIG. 10 is a view showing another embodiment of a connecting mechanism in the invention.

Before the CPU blade 53 is pulled out from the server frame 51, the bolt 6344 attached to the cap 634b is screwed in a female thread portion 614 of the heat release part 612b of the first cooling means 61 by means of a tool from a back surface side of the server frame 51, that is, a right side in FIG. 10 whereby the heat release part 612b of the first cooling means 61 and the cap 634b are coupled together. In addition, a socket 632c is provided with a stopper 6324 so as to prevent the cap 634b from extending from the socket 632c when the heat release part 612b of the first cooling means 61 is inserted into the socket 632c.

During the process of pulling-out, the heat release part 612b of the first cooling means 61 and the cap 634b are separated from each other by removing the bolt 6344 when the cap 634b is moved to the position shown in FIG. 4.

Owing to that structure, in which the cap 634b and the heat release part 612b of the first cooling means 61 are coupled together by means of the tool from the back surface side of the server frame 51 shown in FIG. 2, the embodiment has a feature in making the structure simple as compared with the connecting mechanism on the thermal connector according to the first embodiment of the invention, so that it is possible to improve a complex process in manufacture of an electronic device. On the other hand, while according to the first embodiment of the invention, the heat release part 612 of the first cooling means 61 and the cap 634 are automatically coupled with each other when the heat release part 612 of the first cooling means 61 shown in FIG. 4 is inserted into the socket 632, the second embodiment has a feature in that it is necessary to provide a connection between the heat release part 612b of the first cooling means 61 and the cap 634b in a separate work from that, in which the heat release part 612b of the first cooling means 61 is inserted into the socket 632c.

A thermal connector in a third embodiment according to the invention will be described with reference to FIG. 11. The third embodiment relates to a method of filling a heat conducting medium 631 of a thermal connector and is the same as the first embodiment of the invention in the structures of the first cooling means 61, the second cooling means 62, and the thermal connector except a heat conducting medium filling mechanism.

The third embodiment has a feature in that a medium reservoir 6321b is provided in a position being independent of a socket 632c.

Figure 11:
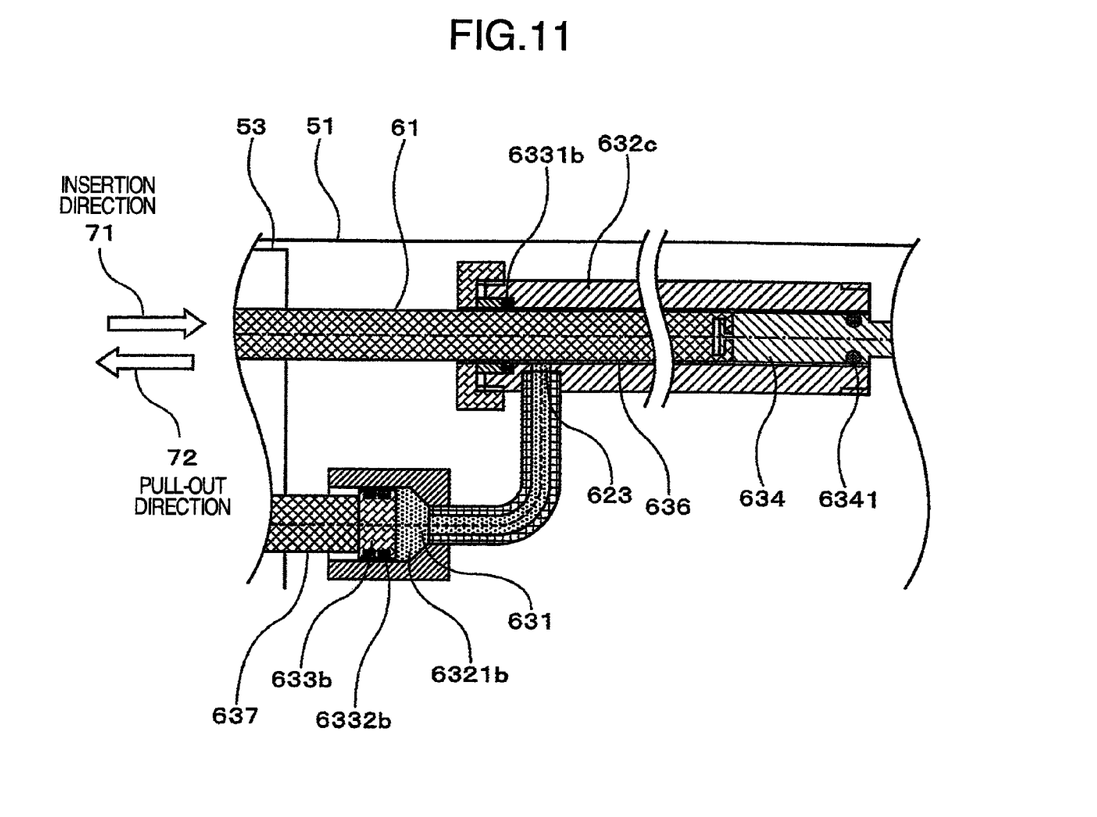
FIG. 11 is a view showing an embodiment of a heat conducting medium filling mechanism in the invention.

As shown in FIG. 11, the medium reservoir 6321b is provided in the position being independent of the socket 632c and communicated to the socket 632c through a medium inflow hole 623. The heat conducting medium 631 is pressurized in the medium reservoir 6321b whereby the heat conducting medium 631 is caused to flow into the clearance 636 from the medium inflow hole 623. A rod 637 serves to pressurize the heat conducting medium 631.

The rod 637 is mounted to the CPU blade 53 sown in FIG. 3 whereby it interlocks with the CPU blade 53 to be pushed and moved in a direction, in which the heat conducting medium 631 is pressurized, to pressurize the heat conducting medium 631. At this time, the rod 637 may be mounted to the CPU blade 53, shown in FIG. 3, through a compression spring (not shown).

Alternatively, the rod 637 may be pushed and moved in a direction, in which the heat conducting medium 631 is pressurized, by different means from the CPU blade 53. At this time, the medium reservoir 6321b may be mounted in a state, in which a side thereof toward a piston 633b is directed rightward in FIG. 11.

In the third embodiment, the medium reservoir 6321b and the clearance 636 are also airtightly structured by sealing members 6331b, 6332b, 6341b in the same manner as in the first embodiment.

Thereby, in the same manner as the case illustrated in FIGS. 4 to 6, a heat resistance between the heat release part 612 of the first cooling means 61 and the heat absorbing part 621 of the second cooling means 62 in FIG. 3 can be made smaller than a predetermined value, which complies with design specifications.

The third embodiment has an advantage that the medium reservoir 6321b is heightened in freedom of arrangement, as compared with the first embodiment.

A neighborhood of the medium reservoir 6321b in the third embodiment is small in number of parts and simple in structure as compared with the neighborhood 6322 of the medium reservoir 6321, shown in FIG. 6, according to the first embodiment, which is many in number of parts and complex in structure.

On the other hand, while the piston 633, shown in FIG. 5, according to the first embodiment is pushed by the first cooling means 61, the third embodiment has a feature in that a piston 633b shown in FIG. 11 must be pushed by the rod 637 being different from the first cooling means 61.

As described above, the invention provides a structure, in which the heat conducting medium 631 is caused to flow into the clearance 636 between the heat release part 612 of the first cooling means 61 and the heat absorbing part 621 of the second cooling means 62 shown in FIG. 3, so that a heat resistance between the heat release part 612 of the first cooling means 61 and the heat absorbing part 621 of the second cooling means 62 can be made smaller than a predetermined value, which complies with design specifications.

Also, according to the invention, the medium reservoir 6321 (6321b in the third embodiment) and the clearance 636 shown in FIG. 5 are structured in airtight by the sealing members 6331, 6332, 6341 (6331b, 6332b, 6341 in the third embodiment), so that it is possible to suppress deterioration of the heat conducting medium 631.

Further, according to the invention, when the heat release part 612 of the first cooling means 61 shown in FIG. 5 is pulled out from the socket 632, the cap 634 (634b in the second embodiment) scrapes off the heat conducting medium 6311 present in the clearance 636 to return the same into the medium reservoir 6321 (6321b in the third embodiment), so that it is possible to repeatedly insert the heat release part 612 of the first cooling means 61 into the socket 632 to fill the heat conducting medium 631 into the clearance 636 therebetween.

It should be further understood by those skilled in the art that although the foregoing description has been made on embodiments of the invention, the invention is not limited thereto and various changes and modifications may be made without departing from the spirit of the invention and the scope of the appended claims.

This application claims priority from Japanese Patent Application 2008-244238, filed Sep. 24, 2008, which is incorporated herein by reference in its entirety.

The invention claimed is:

1. An electronic device comprising:
   a housing;
   plurality of blades each of which is detachable from at least one of sides of the housing and on each of which an electronic part including at least CPU and a memory is mounted;
   first cooling devices each of that takes out heat generated in the blade outside the blade, each of said first cooling device having a heat release part in the form of an elongate column to be fixed to the blade so that a length direction of the column is made substantially in parallel to an insertion direction of the blade into the housing;
   second cooling devices fixed to the housing to discharge heat transported from the first cooling devices outside the housing, each of said second cooling devices having a heat absorbing part provided with an elongate, cylindrical-shaped hole, which is capable of containing the heat release part of the first cooling device;
   medium reservoirs each of which is put in fluid communication with an elongate, pipe-shaped clearance, which is formed between the heat release part of the first cooling device and the heat absorbing part of the second cooling device when the heat release part of the first cooling device is inserted into the heat absorbing part of the second cooling device;
   a heat conducting medium stored in each of the medium reservoirs;
   pressurizing devices for pressurizing the heat conducting medium stored in the medium reservoirs to supply the heat conducting medium to the elongate, pipe-shaped clearances, and
   a detachable connecting part formed between the heat release part of each of the first cooling devices and the heat absorbing part of each of the second cooling devices.

2. The electronic device according to claim 1, further comprising means for returning the heat conducting medium in the clearance into the reservoir when the heat release part of each of the first cooling devices is pulled out of the heat absorbing part of each of the second cooling devices.

3. The electronic device according to claim 1, further comprising a sealing member that structurally closes the medium reservoir and the clearance when the heat release part of each of the first cooling devices is connected to the heat absorbing part of each of the second cooling devices.

4. The electronic device according to claim 1, further comprising a sealing member that structurally closes the medium reservoir when the heat release part of each of the first cooling devices is pulled out of the heat absorbing part of each of the second cooling devices.

5. The electronic device according to claim 1, wherein each of said pressurizing devices comprising a compression spring having an end thereof fixed to each of the blades or each of the first cooling devices to pressurize the heat conducting medium stored in each of the medium reservoirs.

6. A thermal connector for connection between a heat release part and a heat absorbing part with a smaller heat resistance than a predetermined value, the thermal connector comprising: a medium reservoir in fluid communication with a clearance between the heat release part and the heat absorbing part; a heat conducting medium stored in the medium reservoir; pressurizing device that pressurizes the heat conducting medium stored in the medium reservoir to supply the heat conducting medium to the clearance; and a detachable connecting part formed between the heat release part and the heat absorbing part.

* * * * *